United States Patent [19]
Starke

[11] Patent Number: 4,612,659
[45] Date of Patent: Sep. 16, 1986

[54] CMOS DYNAMIC CIRCULATING-ONE SHIFT REGISTER

[75] Inventor: Richard J. Starke, Temple, Pa.

[73] Assignee: AT&T Bell Laboratories, Murray Hill, N.J.

[21] Appl. No.: 629,809

[22] Filed: Jul. 11, 1984

[51] Int. Cl.$^4$ ............................................. G11C 19/00
[52] U.S. Cl. ............................................. 377/72; 377/76; 377/117; 377/126; 377/129
[58] Field of Search ............... 377/72, 76, 115, 116, 377/117, 121, 122, 124, 129, 126

[56] References Cited

U.S. PATENT DOCUMENTS

| | | | |
|---|---|---|---|
| 3,576,447 | 4/1971 | McKenny | 377/76 |
| 3,641,360 | 2/1972 | Yao | 377/72 |
| 3,766,408 | 10/1973 | Suzuki et al. | 377/121 |
| 4,017,741 | 4/1977 | Briggs | 377/79 |
| 4,101,790 | 7/1973 | Ebihara et al. | 377/79 |
| 4,181,862 | 1/1980 | Dingwall | 377/117 |
| 4,403,334 | 9/1983 | Rosler et al. | 377/44 |
| 4,464,774 | 8/1984 | Jennings | 377/117 |
| 4,469,962 | 9/1984 | Snyder | 377/117 |

OTHER PUBLICATIONS

"Double Adjacencies Between Cycles . . . ", *IEEE Trans. on Computers*, vol. C-22, No. 10, Oct. 1973, Lantschoot, pp. 944–955.

"Generating and Counting the Double . . . ", *IEEE Trans. on Computers*, vol. C-24, No. 3, Mar. 1975, Mykkeltveit, pp. 299–304.

"One NOR Gate Starts . . . ", *Electronics*, Apr. 3, 1975, Dujardin, p. 103.

*Primary Examiner*—John S. Heyman
*Attorney, Agent, or Firm*—Wendy W. Koba

[57] ABSTRACT

A CMOS dynamic circulating-one shift register (10) is disclosed. One stage of a conventional N-stage circulating-one shift register is modified to become a control cell (14) which performs two additional functions, referred to as AUTOSET and AUTOCLEAR, to guarantee the existence of a single circulating logic one, after power up or during long-term use. To perform the AUTOCLEAR function, the output (Q3) of the control cell is connected to the CLR inputs of each of the remaining stages ($12_1$-$12_{N-1}$) comprising the shift register. Therefore, when Q3 becomes a logic one, the remaining Q outputs are automatically cleared. The Q output from the control cell is also fed back as the D input to the first stage of the shift register ($12_1$) to continue the circulation process. In relation to the AUTOSET function, the Set outputs from each stage of the shift register are coupled together and applied as an input to the control cell, which performs a wired "OR" operation between the Set outputs and the current D input to the control cell to provide a Q output of logic one from the control cell if and only if all of the Q outputs from each of the remaining stages are equal to a logic zero.

8 Claims, 6 Drawing Figures

CMOS DYNAMIC CIRCULATING-ONE SHIFT REGISTER

BACKGROUND OF THE INVENTION

1. Field of the Invention

The present invention relates to a CMOS dynamic circulating-one shift register and, more particularly, to a circulating-one shift register which is completely self-contained, requiring only a single external clock to guarantee a single circulating one, after power-up or during long-term operation, for a shift register of any desired length.

2. Description of the Prior Art

Many digital control functions require the capability to sequentially select a number of events or operations in a repetitive pattern. A standard design for implementing such a selection process utilizes a counter/decoder configuration. The amount of logic used in this arrangement represents an overdesign and requires a larger silicon area than is necessary to provide the sequential selection function. In particular, the overdesign is related to the fact that: (1) conventional decoders accept a random binary input and produce a well-defined output not needed in a repetitive operation; (2) the counter is an additional level of complexity which is not required to produce the sequential operation; and (3) the counter/decoder circuit is completely static, a feature not necessary for the repetitive selection application.

One prior art arrangement which overcomes some of these problems is discussed in the article "One NOR Gate Starts Shift-Register Loop", by Jean-Pierre Dujardin appearing in *Electronics,* Apr. 3, 1975, at page 103. In the Dujardin circuit, the output from each stage of a shift register is applied as an input to a NOR gate. The output from the NOR gate is fed back to the input of the first stage of the shift register. Therefore, when the output from each shift register stage is equal to a logic 0, the output from the NOR gate will be a logic 1, which is transferred on the next clock pulse to the output of the first stage. So long as only one stage of the shift register has an output signal of a logic 1, the output of the NOR gate will remain a logic 0 and will not affect the cycling of the single logic 1. This circuit requires no external timing to introduce the single logic 1 into the loop and no subsequent resetting. However, the Dujardin arrangement becomes an unacceptable alternative when a large number of stages are included in the shift register, requiring an extremely substantial amount of silicon to lay out the circuit. For example, a 24-stage shift register loop formed using this design would require a 23-input NOR gate, which in CMOS technology translates to approximately 46 MOS transistors, 23 transistors connected in series and 23 transistors connected in parallel.

There remains a need, therefore, for a circulating-one shift register which includes the benefits of the Dujardin arrangement (for example, requiring only a single external clock) and yet may also include any number of individual stages without requiring an unacceptable amount of silicon.

SUMMARY OF THE INVENTION

The need cited above has been addresseed by the present invention, which relates to a CMOS dynamic circulating-one shift register and, more particularly, to a circulating-one shift register which is completely self-contained, requiring only a single external clock to guarantee a single circulating one, after power-up or during long-term operation, for a shift register of any desired length.

It is an aspect of the present invention to provide two functions, AUTO SET and AUTO CLEAR, which monitor the output from each stage of the shift register to set or clear the shift register when either (1) each stage has a logic 0 output; or (2) more than one stage has a logic 1 output, respectively.

Another aspect of the present invention is to provide a single circulating logic 1 utilizing a single input clock.

A further aspect of the present invention is to provide an arrangement which can accommodate any number of shift register stages and can be rearranged at any time to either increase or decrease the number of stages.

Yet another aspect of the present invention is to provide a single circulating logic 1 utilizing a minimum number of devices, allowing the entire arrangement to need a small amount of silicon.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views

DETAILED DESCRIPTION

Figure 1:
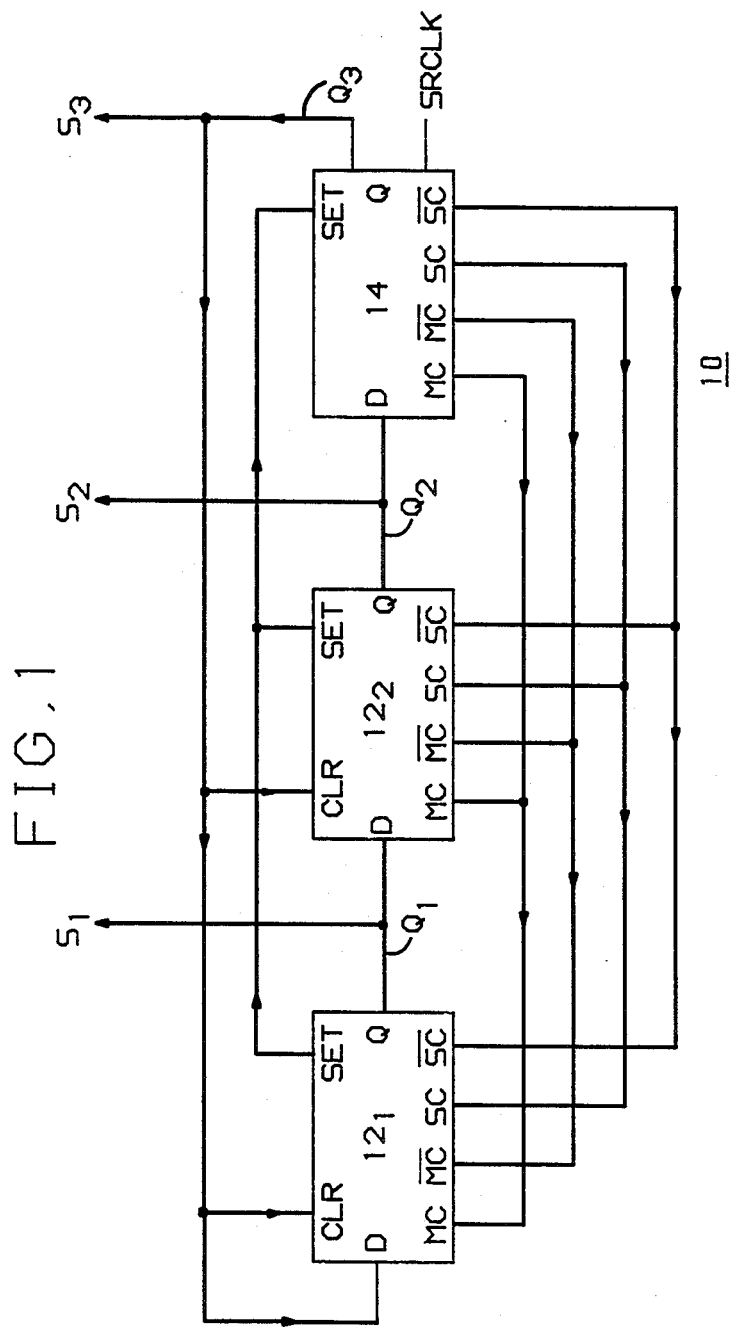
FIG. 1 illustrates a 3-stage CMOS dynamic circulating-one shift register formed in accordance with the present invention.

A circulating-one shift register is a special type of shift register with the circulating pattern, a single logic one, fixed and guaranteed. A three-stage circulating-one shift register 10 formed in accordance with the present invention is illustrated in FIG. 1. Shift register 10 consists of two separate types of shift register cells, (1) a pair of dynamic shift register cells $12_1$ and $12_2$, and (2) a dynamic shift register control cell 14. In general, an N-stage shift register formed in accordance with the present invention would comprise N-1 dynamic shift register cells $12_1$–$12_{N-1}$ and one stage formed as a dynamic register control cell 14. It is the dynamic shift register control cell 14, as will be described in detail hereinafter, which guarantees the presence of a single circulating logic one. The basic function of dynamic shift register control cell 14 is to monitor the status of the plurality of dynamic shift register cells and to either inject a logic one into shift register 10 if the output from each cell is a logic zero (referred to hereinafter as AUTOSET), or clear the output of each dynamic shift register cell if the output from more than one stage is a logic one (referred to as AUTOCLEAR).

Referring now to FIG. 1, both the AUTOCLEAR and AUTOSET operations of the present invention will be briefly described in association with the normal operation of a circulating-one shift register. In order to guarantee the existence of a single logic one when the output from control cell 14, denoted Q3, is equal to a logic one, the outputs from cells $12_1$ and $12_2$, denoted Q1 and Q2, respectively, must be equal to a logic zero. Therefore, in accordance with the AUTOCLEAR function of the present invention, the Q3 output from control cell 14 is connected to the CLEAR input (shown as CLR in FIG. 1) of cells $12_1$ and $12_2$. As is well known in the art, the presence of a logic one at the CLR input of a shift register cell will cause the output of the cell to become a logic zero. Therefore, when Q3 becomes a logic one, Q1 and Q2 are forced to a logic zero value. In accordance with the circulating nature of shift register 10, output Q3 is also applied as the D input to cell $12_1$, in order to continue the passing of the single logic one through each subsequent shift register stage.

In order to perform the AUTOSET function, the SET leads from cells $12_1$ and $12_2$ are connected to the SET input of control cell 14. If both Q1 and Q2 are equal to a logic zero, the SET input to control cell 14 forces Q3 to become a logic one, through a process described in detail hereinafter. As discussed above, the Q3 output is fed back to the D input of cell $12_1$ to continue the circulation process. A complete description of the AUTOSET operation will be made in association with the detailed description of control cell 14. It is to be noted that the position of control cell 14 in the chain of cells forming shift register 10 is completely arbitrary, and is included as the last stage in FIG. 1 merely to aid in the explanation of the operation of the present invention. In some cases, however, the larger size of control cell 14 may dictate its position in the layout of shift register 10.

The operation of shift register 10 is controlled by a single external clock, shown as SRCLK in FIG. 1. SRCLK is designed to provide a two-phase non-overlapping clock, defined as a Master Clock (MC) and a Slave Clock (SC), along with the complements of each, shown in FIG. 1 as $\overline{MC}$ and $\overline{SC}$. SRCLK is applied as an input to control cell 14 which contains additional circuitry (well known in the art and not relevant to the present invention), to generate MC, $\overline{MC}$, SC, and $\overline{SC}$. MC and SC must be non-overlapping due to the presence of information on various floating nodes inside both cells $12_1$ and $12_2$ and control cell 14. If an overlapping clock is utilized, the information at these floating nodes may be destroyed. An illustration of a two-phase non-overlapping clock is included in the timing diagrams of FIGS. 4-6.

Figure 2:
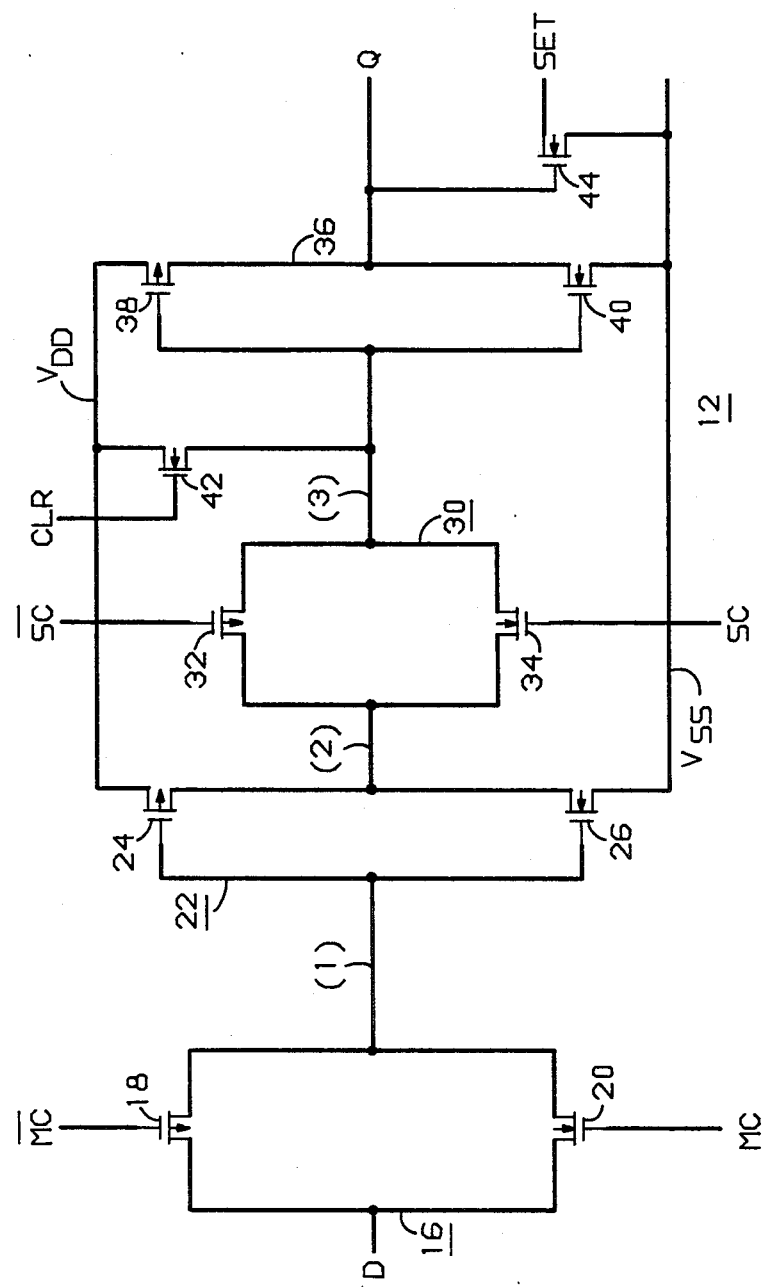
FIG. 2 illustrates an exemplary dynamic shift register cell (DSRC), formed in accordance with the present invention.
Figure 3:
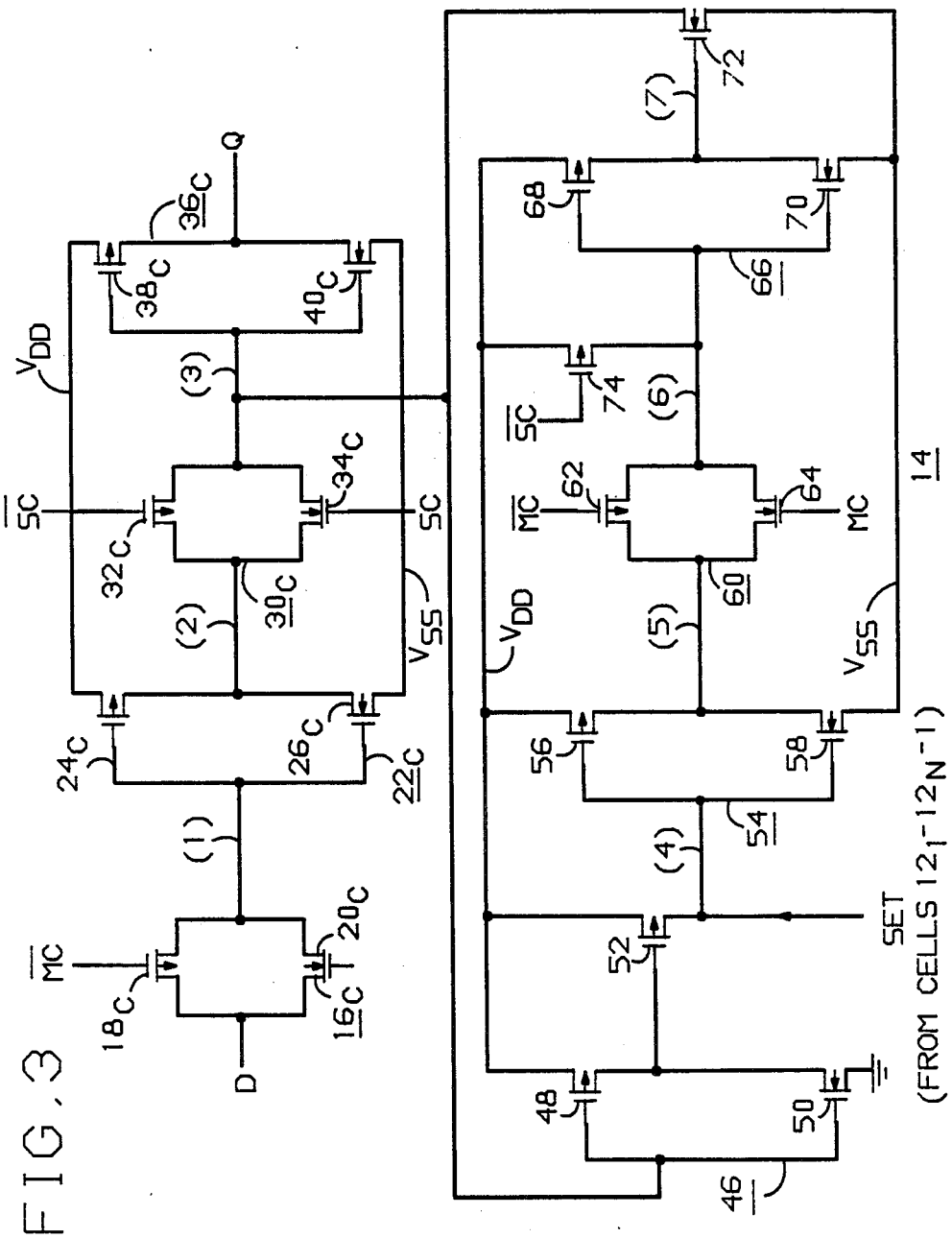
FIG. 3 illustrates an exemplary dynamic shift register control cell (DRSCC) formed in accordance with the present invention.

A CMOS implementation of an exemplary dynamic shift register cell 12 is illustrated in FIG. 2. The basic structure consists of a master stage and a slave stage, each containing a transmission gate and an inverter buffer. In particular, the D input to cell 12 is applied to a master stage transmission gate 16 formed by a P-channel MOS transistor 18 and an N-channel MOS transistor 20 connected as shown in FIG. 2. When the MC signal goes high, the gates of transistors 18 and 20 will be activated, passing the D input signal to the output of transmission gate 16, defined as node (1). (The referenced nodes illustrated in FIGS. 2 and 3 are utilized hereinafter in order to facilitate the understanding of the timing diagrams contained in FIGS. 4-6.) The output of transmission gate 16 is subsequently connected to the input of a master stage inverter buffer 22. Master stage inverter buffer 22, as illustrated in FIG. 2, comprises a P-channel MOS transistor 24 and an N-channel MOS transistor 26 connected in series between the positive and negative power supplies, denoted VDD and VSS. The output of transmission gate 16 is applied as the gate signal to transistors 24 and 26, thus appearing in inverted form at the connection of the source of transistor 24 and the drain of transistor 26, defined as node (2). The output of master stage inverter buffer 22 is subsequently applied as the input to a slave stage transmission gate 30. A P-channel MOS transistor 32 and an N-channel MOS transistor 34 form slave stage transmission gate 30, where the gates of transistors 32 and 34 are controlled by the operation of $\overline{SC}$ and SC, respectively. Therefore, when the SC signal goes high, the inverted value appearing at the input of slave stage transmission gate 30 is passed through to the output, defined as node (3). The output of slave stage transmission gate 30, like that of master stage transmission gate 16, is connected to the input of its associated inverter buffer 36. As shown in FIG. 2, slave stage inverter buffer 36 comprises a P-channel MOS transistor 38 and an N-channel MOS transistor 40 connected in series between VDD and VSS. The output of slave stage inverter buffer 36, which appears at the interconnection of the source of transistor 38 and the drain of transistor 40, is defined as the Q output of shift register cell 12.

In association with the AUTOCLEAR function of the present invention, an N-channel MOS transistor 42 is connected between VDD and the input to slave inverter buffer 36. The gate of transistor 42 is activated by the CLR signal, which as described above in association with FIG. 1, is the Q output from dynamic shift register control cell 14. Therefore, when the Q output from control cell 14 is a logic one, transistor 42 will be turned on, and the input to inverter buffer 36 will raise to the level of VDD, forcing the output of inverter buffer 36, and hence the Q output of cell 12, to become a logic zero. In association with the AUTOSET operation of the present invention, an N-channel MOS transistor 44 is included in shift register cell 12, where the source of transistor 44 is connected to VSS and the gate of transistor 44 is activated by the Q output of cell 12. Therefore, when Q is equal to a logic one, transistor 44 is on, keeping the drain of transistor 44, the SET interconnection to the remaining cells, at VSS, or logic zero.

An exemplary dynamic shift register control cell 14 is illustrated in detail in FIG. 3. The top portion of control cell 14 is similar in layout and design to previously described cell 12, that is, control cell 14 also consists of a master stage and a slave stage, each including a transmission gate and an inverter buffer. For purposes of differentiation, a subscript C, denoting control, has been included with the transistors which appear in both cell 12 and control cell 14. Unlike cell 12, however, control cell 14 does not include a pair of transistors for clearing and setting its Q output. Instead, control cell 14 further comprises a plurality of control transistors which perform the above-described AUTOSET function.

In association with the AUTOCLEAR function, as described above, when Q3 is equal to a logic one, transistor 42 of each cell 12 will be activated, pulling node (3) to VDD, thus providing a Q output of logic zero for each cell 12. In association with the AUTOSET operation of the present invention, as seen by reference to FIG. 3, the output of slave stage transmission gate $30_C$, appearing at node (3), is utilized as the input signal to the AUTOSET control circuitry. In particular, the signal at node (3) is applied as an input to a level shifting inverter 46, which comprises a series connection of a P-channel MOS transistor 48 and an N-channel transistor 50, connected between VDD and ground (0 volts). The output from inverter 46 is connected to the gate of a P-channel MOS transistor 52, where the drain of transistor 52 is connected to VDD and the source of transistor 52, defined as node (4), is connected to the SET leads from each of the plurality of cells $12_1$-$12_{N-1}$ included in N-stage shift register 10. The aspect ratio of transistor 52, is on the order of 5/500 where its size relative to the rest of the transistors (approximately 5/6, 10/6, or 20/6, depending on its particular use) is important to the AUTOSET function of the present invention, as will be described hereinafter. The interconnection of the plurality of SET inputs is subsequently applied as an input to an inverter buffer 54 formed by a P-channel MOS transistor 56 and an N-channel MOS transistor 58 connected in series between VDD and VSS. The output of inverter buffer 54, defined as node (5), is subsequently applied as an input to a transmission gate 60, formed by a P-channel MOS transistor 62 and an N-channel MOS transistor 64. As shown in FIG. 3, transmission gate 60 is activated by the MC signal. The output of transmission gate 60, defined as node (6), is subsequently applied as an input to an inverter buffer 66, consisting of a P-channel MOS transistor 68 and an N-channel MOS transistor 70, connected in series between VDD and VSS. The output from inverter buffer 66 is applied as the gate input to an N-channel MOS transistor 72, where the drain of transistor 72, as can be seen by reference to FIG. 3, is connected to node (3), the output from slave stage transmission gate 30. The source of transistor 72 is connected to VSS. An additional P-channel MOS transistor 74 is connected between VDD and the input to second inverter buffer 66, where the gate of transistor 74 is activated by the $\overline{SC}$ signal.

The key to the AUTOSET operation of the present invention is the wired "OR" formed between the plurality of transistors $44_1$-$44_{N-1}$ located in the plurality of cells $12_1$-$12_{N-1}$ and transistor 52 of the control portion of control cell 14. During normal operation, the existence of a logic one in any cell $12_i$ will turn on its associated transistor $44_i$, pulling the SET node (the drain of transistor $44_i$) to VSS. At the same time, the presence of a logic zero in control cell 14 results in a logic one being present at node (3), and thus at the input to level shifting inverter 46. The logic zero at the output of inverter 46 results in turning on transistor 52, which then attempts to pull the SET node to VDD. The SET node, however, is easily pulled to VSS, due to the distorted aspect ratio of transistor 52 (5/500) and its reduced turn-on capability due to the level shifting associated with inverter 46 which provides a logic zero of only 0 volts, not VSS. When a circulating logic one reaches control cell 14, inverter 46 turns off transistor 52, preventing any unnecessary DC power dissipation. In accordance with the present invention, the AUTOSET operation is initiated when all of the plurality of shift register cells $12_1$-$12_{N-1}$ contain a logic zero. When this condition exists, all transistors $44_1$-$44_{N-1}$ are off and transistors 52 of control cell 14 is on. Without any competition from transistors $44_1$-$44_{N-1}$, transistor 52 can easily pull the SET node to VDD. The SET node eventually reaches the threshold of inverter 54, causing the transfer of a logic zero to the output of transmission gate 60 during the next MC phase. This logic zero is subsequently transformed to a logic one by inverter 66, thus turning on transistor 72. The activation of transistor 72 results in node (3) of control cell 14 to be pulled down to VSS, that is, node (3) will be forced to a logic zero value. This logic zero then passes through slave stage inverter buffer $36_C$ to produce, in accordance with the AUTOSET operation, a Q output of control cell 14 equal to a logic one. As discussed hereinabove, the Q output from control cell 14 is subsequently applied as the D input to the first cell $12_1$ of shift register 10 to continue the circulation of the single logic one.

Figure 4:
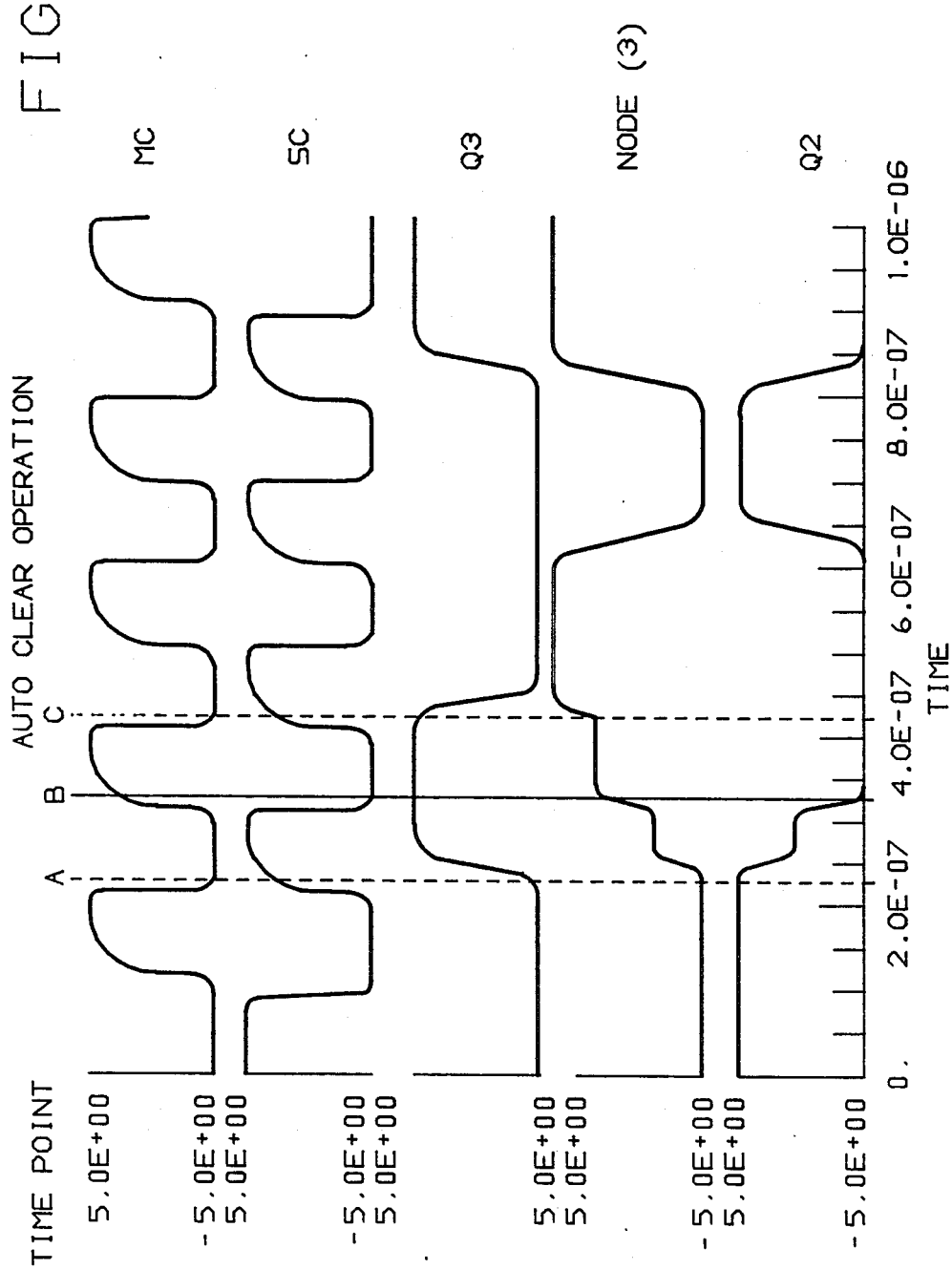
FIG. 4 contains a timing diagram illustrating the operation of the AUTO CLEAR function of the present invention.

The timing diagram of FIG. 4 may be utilized to demonstrate the AUTOCLEAR operation of the present invention. Referring to FIG. 4, shift register 10 is initialized to contain two circulating ones, located in cells $12_1$ and $12_2$ of an exemplary 3-stage shift register. As the SC phase in entered, time point A in FIG. 4, Q3 goes high, starting the AUTOCLEAR operation. At this point transistors $42_1$ and $42_2$ of cells $12_1$ and $12_2$, respectively, turn on, attempting to pull the associated node (3) to its body-effect-limited value. As can be seen, both node (3) and Q2 rest at intermediate logic levels. This is due to master stage inverter buffer 22 and transistor 42 bringing node (3) to opposite logic levels. It is not until the MC phase is entered, illustrated as time point B, that node (3) is successfully pulled above an inverter threshold and Q2 goes low. It is to be understood that Q1 will follow the same process as Q2, and is not shown in FIG. 4 in order to minimize the number of points which have to be illustrated. The only remaining step in the AUTOCLEAR operation occurs during the next SC phase, time point C, which pulls node (3) to a full logic one. This is required to terminate DC power dissipation caused by intermediate input logic levels feeding slave stage inverter buffer 36. Power dissipation by inverter 36 is approximately 3.6 mW, under worst case processing and temperature conditions, and is considered acceptable because it only occurs when an AUTOCLEAR operation is required, and then for only one SRCLK cycle.

Figure 5:
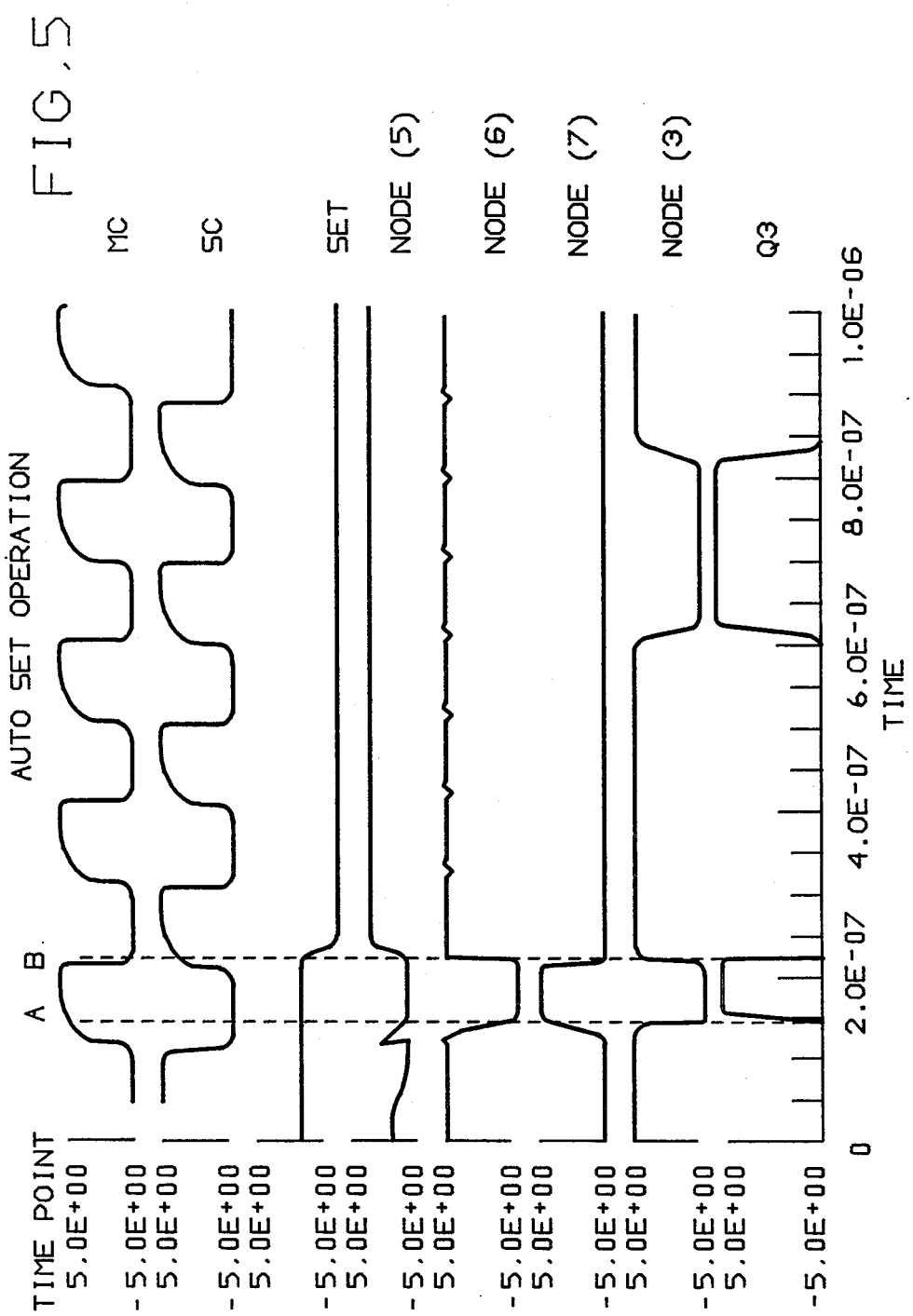
FIG. 5 contains a timing diagram illustrating the operation of the AUTO SET function of the present invention.

FIG. 5 contains a timing diagram illustrating the AUTOSET operation of the present invention. In this case, cells $12_1$ and $12_2$ of an exemplary three-stage shift register 10 are initialized to contain a logic zero. As stated above, when this condition exists, transistors $44_1$ and $44_2$ are off, and transistor 52 of control cell 14 is on, pulling the SET node to VDD. This is illustrated in FIG. 5 where the SET node is initialized to approximately $-1.25$ V. At time point A, the SET node reaches the threshold of inverter 54, causing the discharge of node (6) during this MC phase. Therefore, as seen by reference to FIG. 5, node (7) is pulled high, turning on transistor 72 which results in node (3) falling to the VSS level and the Q output of control cell 14 becoming a logic one. As the next SC phase is entered, time point B, all intermediate logic levels are brought to full logic levels and the AUTOSET operation is complete. In particular, node (6) is brought to a full logic one and the SET node is brought to a full logic zero level.

Figure 6:
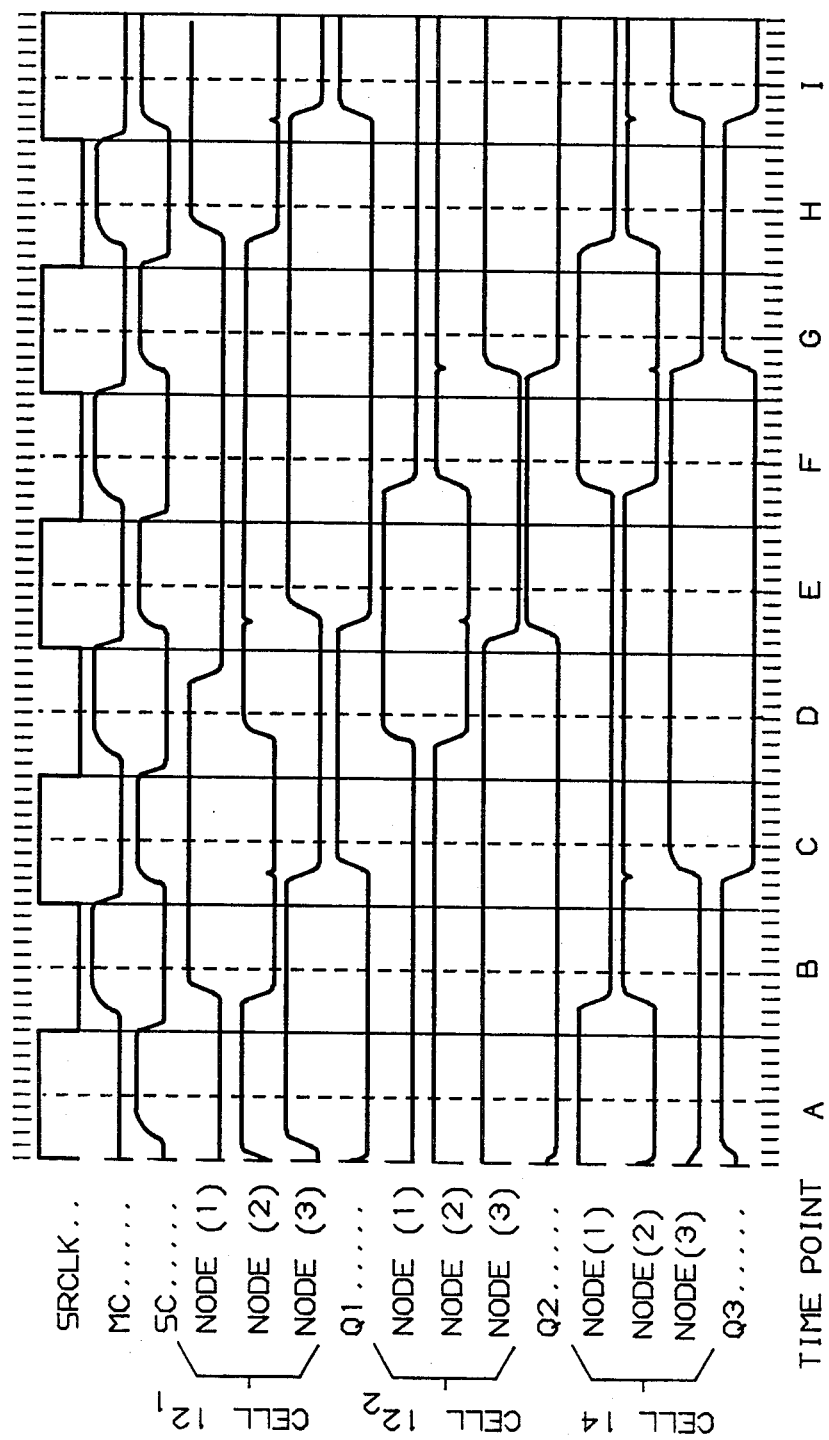
FIG. 6 contains a timing diagram illustrating the operation of a 3-stage dynamic circulating-one shift register formed in accordance with the present invention.

A timing simulation of a three-stage shift register 10 is shown in FIG. 6. In order to display the normal operation of an exemplary shift register 10, cells $12_1$ and $12_2$ are initialized to a logic zero and control cell 14 to a logic one (time point A). During the first MC phase, illustrated as time point B, the logic one existing on Q3 is loaded into the master stage of $12_1$, as seen by the transitions on nodes (1) and (2) of cell $12_1$. The SC phase (time point C) transfers this logic one to the slave stage of cell $12_1$, as seen by the transitions on nodes (3) and Q1. This process continues through the remaining stages of shift register 10, and begins to repeat at time point H. During normal operation, a single circulating logic one, power dissipation is related to the shift rate of the circuit. Because only one cell is making a level transition at any one time, dynamic power dissipation is negligible.

What is claimed is:

1. A dynamic, circulating-one N-stage shift register (10) for circulating a plurality of N-1 logic zeroes and a single logic one through the N stages, said shift register comprising
   a plurality of N−1 shift register cells, ($12_1$-$12_{N-1}$), each cell comprising a D input, a Q output, a Clear input, and a Set output, said plurality of N−1 shift register cells sequentially disposed such that the Q output of a first shift register cell (Q1) is connected to the D input of a second shift register cell (D2), and continuing in a like manner where the Q output of the N−2nd shift register cell ($Q_{N-2}$) is connected to the D input of the N−1st shift register cell, for passing the value appearing at the associated D input to the associated Q output at the completion of both a master clock (MC) phase and a slave clock (SC) phase, where said master clock and said slave clock phases are non-overlapping; and
   a shift register control cell (14) comprising a D input, a Q output, and control means, wherein the Q output from the N−1st shift register cell ($Q_{N-1}$) is connected to the D input of said control cell and the Q output from said control cell is connected to both the D input of the first shift register cell (D1) and the pluarlity of N−1 Clear inputs of said plurality of N−1 shift register cells for clearing the Q output of each shift register cell to the value of logic zero when the Q output of said shift register control cell ($Q_N$) is equal to a logic one, said shift register control cell control means responsive to the plurality of N−1 Set outputs from said plurality of N−1 shift register cells for providing a Q output from said control cell equal to a logic one when the plurality of N−1 Q outputs from said plurality of N−1 shift register cells are all equal to a logic zero.

2. A dynamic circulating-one N-stage shift register in accordance with claim 1 wherein each shift register cell ($12_1$-$12_{N-1}$, 14) of the plurality of N shift register cells comprises
   a master stage including a transmission gate (16) responsive to the associated D input and activated by the master clock, and an inverter buffer (22) connected to the output of said transmission gate; and
   a slave stage including a transmission gate (30) responsive to the output from said master stage inverter buffer and activated by the slave clock, and an inverter buffer (36) connected to the output of said slave stage transmission gate, wherein the output from said slave stage inverter buffer is defined as the associated Q output signal.

3. A dynamic circulating-one N-stage shift register as defined in claim 2 wherein
   each transmission gate comprises a P-channel MOS transistor (18,32) and an N-channel MOS transistor (20,34), where the drain of said P-channel transistor is connected to the source of said N-channel transistor and is responsive to the associated input signal, the source of said P-channel transistor is connected to the drain of said N-channel transistor and provides the associated output signal, the gate of said N-channel transistor being activated by the associated clock signal (MC,SC) and the gate of said P-channel transistor being activated by the complement of said associated clock signal ($\overline{MC},\overline{SC}$); and
   each inverter buffer comprises a P-channel MOS transistor (24,38) and an N-channel MOS transistor (26,40) connected in series such that the drain of said P-channel transistor is connected to a positive power supply (VDD), the gate of said P-channel transistor is connected to both the gate of said N-channel transistor and the output of the associated transmission gate, the source of said N-channel transistor is connected to a negative power supply (VSS), and the drain of said N-channel transistor is connected to the source of said P-channel transistor where this interconnection provides the associated output.

4. A dynamic circulating-one N-stage shift register as defined in claim 2 wherein each of the plurality of N−1 shift register cells further comprises
   a first switching means connected between a positive power supply (VDD) and the input of the slave stage inverter buffer, said first switching means responsive at the Clear input applied to the shift register cell to the Q output from said control cell for connecting the input of said slave stage inverter buffer to said positive power supply when said Q output from said control cell is equal to a logic one, thus providing a Q output of said associated shift register cell equal to a logic zero; and
   a second switching means connected between a negative power supply (VSS) and the Set output of said associated shift register cell, said second switching means activated by the Q output of said associated shift register cell for providing a Set output of logic zero when said Q output of said associated shift register cell is equal to a logic one and a Set output equal to a logic one when said Q output of said associated shift register cell is equal to a logic zero.

5. A dynamic circulating-one N-stage shift register as defined in claim 4 wherein
   each first switching means comprises an N-channel MOS transistor (42) where the drain of said N-channel transistor is connected to the positive power supply, the source of said N-channel transistor is connected to the input of the associated slave stage inverter buffer, and the gate of said N-channel transistor is activated by the Q output from the control cell; and
   each second switching means comprises an N-channel MOS transistor (44) where the drain of said N-channel transistor is connected to the Set output of the associated shift register cell, the source of said N-channel transistor is connected to the negative power supply, and the gate of said N-channel transistor is activated by the Q output of said associated shift register cell.

6. A dynamic circulating-one N-stage shift register as defined in claim 2 wherein the shift register control cell further comprises control means (46-72) responsive to both the output of the control cell slave stage transmission gate and the plurality of N−1 Set outputs from the plurality of N−1 shift register cells for comparing said plurality of N−1 Set outputs to said output from said slave stage transmission gate for producing a Q output of said control cell equal to a logic one if and only if the plurality of N−1 Q outputs from said plurality of N−1 shift register cells are all equal to a logic zero value.

7. A dynamic circulating-one N-stage shift register as defined in claim 6 wherein the control means comprises a level-shifting inverter (46) responsive to the output of the slave stage transmission gate for providing a maximum negative output signal more positive than the negative power supply;

threshold means (52) responsive both to the output from said level-shifting inverter and the plurality of N−1 Set outputs from the plurality of N−1 shift register cells for providing an output equal to a logic one if and only if the plurality of N−1 Q outputs from said plurality of N−1 shift register cells are all equal to a logic zero value;

a first inverter buffer (54) responsive to the output from said threshold means for providing as an output the inverse of the output provided by said threshold means;

a transmission gate (60) connected to the output of said first inverter buffer and activated by master clock for passing through as an output the inverted output from said threshold means during a master clock phase;

a second inverter buffer (66) connected to the output of said transmission gate for providing as an output the threshold means output signal; and switching means connected between the negative power supply and the input of the slave stage inverter buffer, said switching means activated by the output of said second inverter buffer for connecting said input of said slave stage inverter buffer to said negative power supply if and only if the plurality of N−1 Q outputs from the plurality of N−1 shift register cells are all equal to a value of logic zero.

8. A dynamic circulating-one N-stage shift register as defined in claim 7 wherein the level-shifting inverter comprises a P-channel MOS transistor (48) and an N-channel MOS transistor (50) connected in series such that the drain of said P-channel transistor is connected to the positive power supply, the gate of said P-channel transistor is connected to both the gate of said N-channel transistor and the output of the slave stage transmission gate, the source of said N-channel transistor is connected to a power supply more positive than the negative power supply, and the source of said P-channel transistor is connected to the drain of said N-channel transistor where this interconnection provides a level-shifted output signal;

the threshold means comprises an N-channel MOS transistor (52) which includes a channel length at least one order of magnitude greater than the channel length of any other transistor included in said shift register, the drain of said N-channel transistor connected to said positive power supply, the source of said N-channel transistor connected to the plurality of N−1 Set outputs from the plurality of N−1 shift register cells, and the gate of said N-channel transistor activated by the level-shifted output signal such that said threshold means provides an output value at said source equal to a logic one if and only if the plurality of N−1 Q outputs from the plurality of N−1 shift register cells are all equal to a logic zero;

the first inverter buffer comprises a P-channel MOS transistor (56) and an N-channel MOS transistor (58) where the drain of said P-channel transistor is connected to said positive power supply, the gate of said P-channel transistor is connected to both the gate of said N-channel transistor and the output from said threshold means, the source of said N-channel transistor is connected to the negative power supply, and the drain of said N-channel transistor is connected to the source of said P-channel transistor for providing an output signal of logic one if and only if said plurality of N−1 Q outputs are all equal to a logic zero;

the transmission gate comprises a P-channel MOS transistor (62) and an N-channel MOS transistor (64), the drain of said P-channel transistor connected to both the source of said N-channel transistor and the output from said first inverter buffer, the source of said P-channel transistor connected to the drain of said N-channel transistor, the gate of said N-channel transistor being activated by the master clock and the gate of said P-channel transistor being activated by the complement of said master clock for providing an output signal at the connection of P-channel source and N-channel drain during each positive phase of said master clock;

the second inverter buffer comprises a P-channel MOS transistor (68) and an N-channel MOS transistor (70) where the drain of said P-channel transistor is connected to said positive power supply, the gate of said P-channel transistor is connected to both the gate of said N-channel transistor and the output from said transmission gate, the source of said N-channel transistor is connected to said negative power supply, and the drain of said N-channel transistor is connected to the source of said P-channel transistor for providing as an output an inverse value of the signal passing through said transmission gate during each positive of said master clock; and the switching means comprises an N-channel MOS transistor (72) where the source of said N-channel transistor is connected to said negative power supply, the drain of said N-channel transistor is connected to the input of said slave stage inverter buffer, and the gate of said N-channel transistor is activated by the output of said second inverter buffer, where said N-channel transistor is turned on if and only if said plurality of N−1 Q output signals are all equal to a logic zero, connecting said input of said slave stage inverter buffer to said negative power supply to provide a logic zero input to said slave stage inverter buffer and thus provide a Q output from the shift register control cell equal to a logic one.

* * * * *